(12) United States Patent
Friedman et al.

(10) Patent No.: US 8,286,067 B2
(45) Date of Patent: Oct. 9, 2012

(54) METHOD FOR TRANSMITTING SAMPLED DATA AND CONTROL INFORMATION BETWEEN A DSP AND AN RF/ANALOG FRONT-END

(75) Inventors: Vladimir Friedman, Scotch Plains, NJ (US); Reza Alavi, Belle Mead, NJ (US); Raju Hormis, New York, NY (US); Leo Montreuil, Atlanta, GA (US)

(73) Assignee: Analog Devices, Inc., Norwood, MA (US)

( * ) Notice: Subject to any disclaimer, the term of this patent is extended or adjusted under 35 U.S.C. 154(b) by 404 days.

(21) Appl. No.: 12/581,740

(22) Filed: Oct. 19, 2009

(65) Prior Publication Data

US 2010/0199158 A1 Aug. 5, 2010

Related U.S. Application Data

(60) Provisional application No. 61/150,299, filed on Feb. 5, 2009.

(51) Int. Cl.
*G06F 11/10* (2006.01)
(52) U.S. Cl. ......... 714/807; 375/216; 375/222; 375/230
(58) Field of Classification Search .................. 714/807; 375/216, 222, 230
See application file for complete search history.

(56) References Cited

U.S. PATENT DOCUMENTS

| | | | |
|---|---|---|---|
| 6,021,167 A | 2/2000 | Wu | |
| 6,263,016 B1 | 7/2001 | Bellenger et al. | |
| 6,404,804 B1* | 6/2002 | Mannering et al. | 375/222 |
| 6,704,324 B1* | 3/2004 | Holmquist | 370/465 |
| 6,842,429 B1* | 1/2005 | Shridhar et al. | 370/252 |
| 7,020,266 B2 | 3/2006 | Bremer et al. | |
| 7,218,628 B2 | 5/2007 | Chiu et al. | |
| 7,729,384 B1* | 6/2010 | Mantri et al. | 370/476 |
| 2001/0022836 A1* | 9/2001 | Bremer et al. | 379/88.13 |
| 2002/0041570 A1* | 4/2002 | Ptasinski et al. | 370/252 |
| 2003/0067893 A1 | 4/2003 | Dupuy et al. | |
| 2004/0071101 A1* | 4/2004 | Lu et al. | 370/282 |
| 2006/0093023 A1* | 5/2006 | Brown et al. | 375/219 |
| 2006/0153196 A1* | 7/2006 | Diaz et al. | 370/395.1 |
| 2007/0110053 A1 | 5/2007 | Soni et al. | |

* cited by examiner

*Primary Examiner* — Charles Ehne
(74) *Attorney, Agent, or Firm* — Kenyon & Kenyon LLP

(57) ABSTRACT

A method for delivering control information together with sampled data between a DSP and an RF/analog front-end in a high speed communication modem, which embeds sampled data and control information in frames to be transferred over one interface. A frame may comprise various fields, each may consist of one or more bytes or octets. The frame may have a data field for carrying the sampled data, and at least one control field for transferring the control information to update RF/analog front-end registers. The control field may include an octet containing a control address, an octet containing a control command, and an octet containing control data. The frame may also provide means of synchronization, e.g., by using a sync field to identify the frame boundary.

28 Claims, 6 Drawing Sheets

METHOD FOR TRANSMITTING SAMPLED DATA AND CONTROL INFORMATION BETWEEN A DSP AND AN RF/ANALOG FRONT-END

CROSS-REFERENCE TO RELATED APPLICATIONS

This application claims priority to U.S. Provisional Patent Application No. 61/150,299, filed on Feb. 5, 2009, entitled "A PACKET-BASED METHOD OF TRANSMISSION OF SAMPLED DATA AND CONTROL INFORMATION TO AN RF/ANALOG FRONT-END," which is herein incorporated by reference in its entirety.

BACKGROUND

The present invention relates generally to home networking, and more specifically to an interface between a digital signal processor (DSP) and an analog front-end (AFE) in high speed communication modems used in home networking.

Nowadays, millions of households are using home networking to share high-speed Internet access, data and multimedia files among various electrical devices in a house, e.g., desktop computers, laptop computers, printers, hard disk drives, digital video recorders (DVRs) and routers. An electrical device, which is a node in the network, may communicate with other devices via a high-speed communication modem. The high-speed communication modem may have a DSP and an analog front-end, which includes a digital-to-analog converter (DAC) on the transmitting side and an analog-to-digital converter (ADC) on the receiving side. A radio frequency (RF) transceiver may be used for wireless communications between a DSP and an analog front-end.

Several home networking standards, such as Multimedia over Coax Alliance (MoCA) and the G.hn Home Networking Standard in the ITU, specify high speed data rates (160 Mb/sec and higher). Accordingly, sampled data, e.g., 10 bits at 200 Mhz sample rate, must be transferred from a DSP to an analog front-end through a high speed parallel interface with a large number of pins or through a very high speed serial interface. The home-networking systems use time division multiplex access (TDMA) to send data across the network. Each node has in its memory a table containing the transmission parameters for connection with other nodes in the network. Some of these parameters, such as the transmitting (Tx) gain and receiving (Rx) gain of an RF/analog front-end are controlled by the DSP and must be transmitted to an RF/analog front-end in a very short interval of time. Known home networking systems use another high speed interface, separated from the interface for transmitting sampled data, to transfer control information such as the transmission parameters between a DSP and an RF/analog front-end. The two interface solution is inefficient and costly.

The JESD204A standard, 'Serial Interface for Data Converters,' allows the transmission of sampled data and control information through one serial interface in frames. A frame may comprise various fields, each consisting of, for example, one or more octets of information. The length of each frame and the number of I/Q channel samples to be sent in each packet generally is fixed for a certain application. The JESD204A standard specifies two methods for handling the control information. The first one is to append one control bit to each I/Q channel sample. It means that the ratio between the sampled data rate and the control information rate is fixed, determined by the number of samples in a packet. This in turn may limit the speed at which the control information is updated. The second method is to follow a packet of several samples by a control word, the length of which is equal to the number of control bits per sample times the number of samples. However, the JESD204A standard does not provide details of the control word. In addition, since the control word comes at the end of the frame, there is an additional delay in the processing of the control information.

Therefore, it would be desirable to improve the interface between the DSP and the RF/analog front-end in a high speed communication modem to transfer sampled data and control information efficiently and flexibly.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

DETAILED DESCRIPTION

The present invention provides a flexible way of delivering control information together with sampled data between a DSP and an RF/analog front-end (AFE) in a high speed communication modem, by embedding sampled data and control information in frames to be transferred over a common interface. A frame may comprise various fields, each may consist of one or more bytes or octets. The frame may include a data field for carrying the sampled data that ultimately is relayed to or from a channel by an AFE. The frame further may include a control field for transferring the control information to update RF/analog front-end registers (AFE) but would not be relayed to/from the AFE as the sampled data would be. The control field may include an octet containing a control address, an octet containing a control command, and an octet containing control data. The frame may also include a header or a frame sync field to identify frame boundaries. The frame may facilitate error detection and correction by a cyclic redundancy check (CRC) octet and the repetition of the control field. The frame may further mitigate effects of the impulse noise by spacing two identical control fields far apart.

Figure 1A:
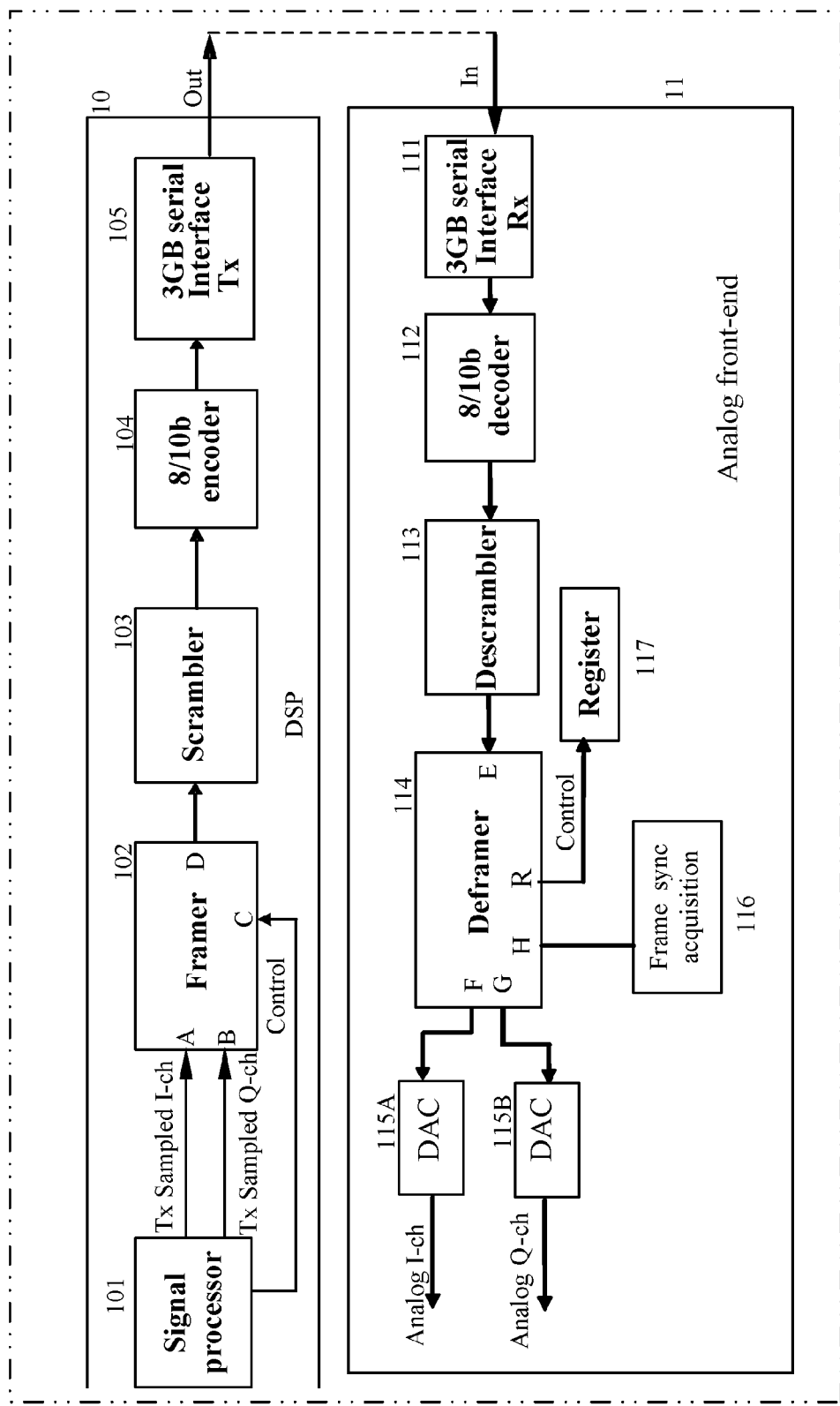
FIGS. 1A and 1B illustrate a communication path between high speed communication modems according to one embodiment of the present invention.
Figure 1B:
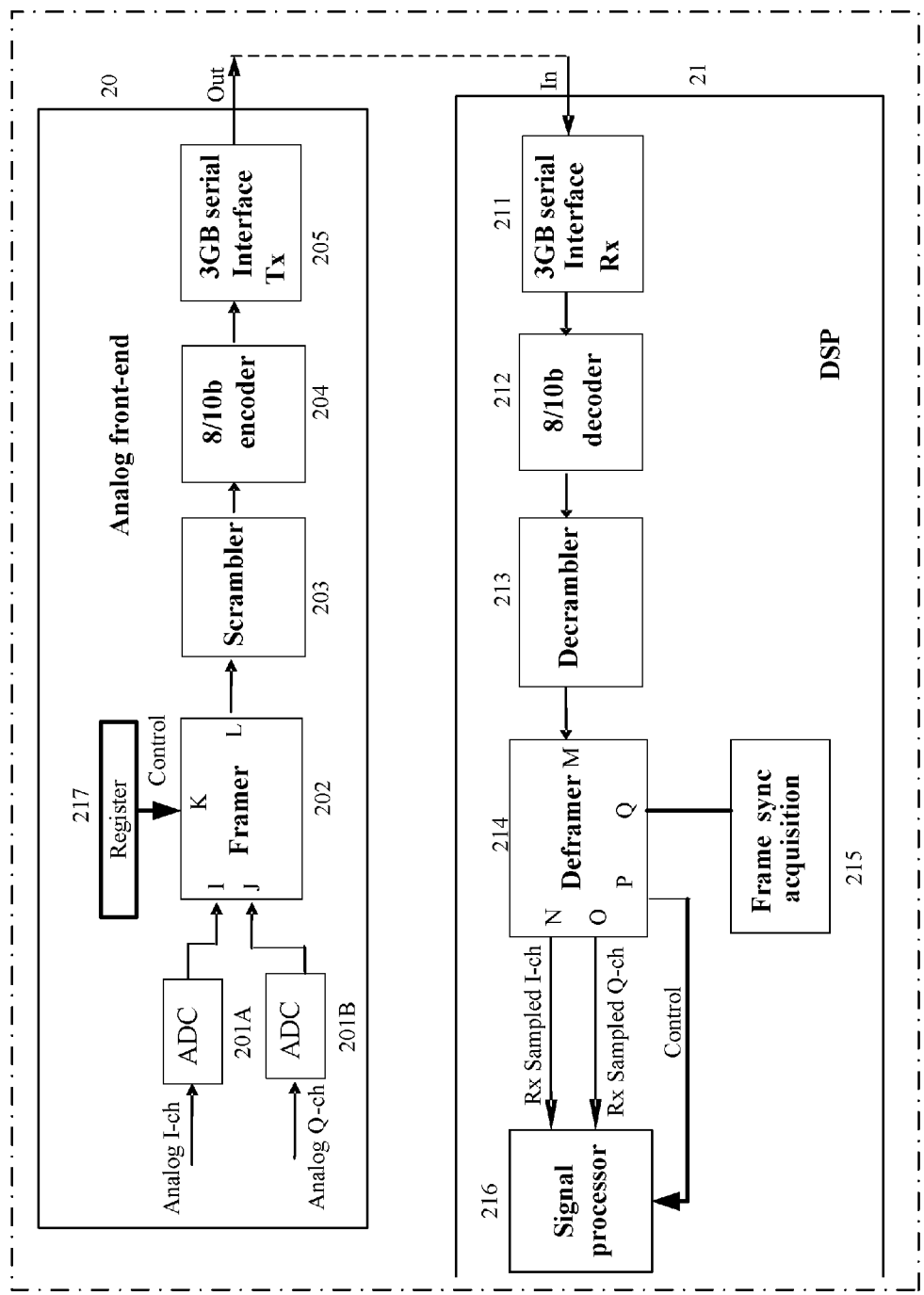

FIGS. 1A and 1B illustrate a data communication path between a pair of high speed communication modems according to one embodiment of the present invention. Data may be transmitted by a first modem 1 and received by a second modem 2. The modem 1 may have a DSP 10 and an RF/analog front end 11 and the modem 2 may have a DSP 20 and an RF/analog front end 21.

The data communication path may include a transmitting path and a receiving path. The transmitting path, as shown in FIG. 1A, may be used to transmit sampled data and control information from a signal processor 101 in the DSP 10 to the RF/analog front end 11. The transmitting path may include a framer 102, a scrambler 103, an encoder 104 and a serial interface transmitter 105 in the DSP 10, and a serial interface receiver 111, a decoder 112, a descrambler 113, a deframer 114, a frame sync acquisition module 116 and DACs 115A and 115B in the RF/analog front end 11. The receiving path, as shown in FIG. 1B, may pass received sampled data and control information from the analog front-end 20 to a signal processor 216 in the DSP 21. The receiving path may include ADCs 201A and 201B, a framer 202, a scrambler 203, an encoder 204, and a serial interface transmitter 205 in the analog front end 20, and a serial interface receiver 211, a decoder 212, a descrambler 213, a deframer 214 and a frame sync acquisition module 215 in the DSP 21.

FIG. 1A illustrates modem components involved in transmission and FIG. 1B illustrates modem components involved in reception. In implementation, many modem devices will be capable of bi-directional communication and, therefore, the modem devices may include components of FIGS. 1A and 1B.

In a high speed communication modem, the flow of the control information generally is from the DSP, or more specifically, the signal processor of the DSP, to the RF/analog front-end. In a transmitting path, the control information may consist of information about write/read operations of the RF/analog front-end registers. In a receiving path, the control information may consist of acknowledgement of the execution of the commands, the content of registers in the case of read operations, synchronization events on the serial interface (e.g., loss of synchronization), etc.

Specifically, in the transmitting path, the framer 102 may receive sampled data (e.g., I-channel sampled data I-ch and Q-channel sampled data Q-ch) and control information from the signal processor 101 at inputs A, B and C respectively. The framer 102 may organize the received sampled data and control information in a predetermined format, e.g., the one shown in FIG. 2, to generate frames each containing both sampled data and control information and output the frames at an output D.

In one embodiment, the framer 102 may generate and add frame sync acquisition information to a frame to help the deframer 114 to locate the start of a frame.

The scrambler 103 may receive the frames from the framer 102 at its input, randomize the received frames, and send out randomized frames at an output.

In data transmission, a large number of contiguous binary ones in a data stream may produce a highly positive DC signal, and a large number of contiguous binary zeros may produce a highly negative DC signal. The encoder 104 receive the randomized frames from the scrambler 103, and encode the frames such that the DC value of the output stream may be close to 0. The encoder 104 may be, e.g., an 8/10 bit encoder (IEEE802.3z standard).

The serial interface transmitter 105 may transmit a serial bit stream formed by the encoder 104 to the AFE 11 at a high data rate, for example, 3 GB/s. It may receive the encoded frames from the encoder 104 at an input, and transmit them to the analog front end 11. In one embodiment, the serial link between the DSP and AFE is a wired bus—electrical or optical. In one embodiment, the link between the DSP and AFE may be wireless.

The analog front end 11 may invert data packing operations performed by the DSP 10. For example, the serial interface receiver 111 may be a high data rate receiver (e.g., 3 GB/s), and the decoder 112 may be an 8/10 bit decoder (IEEE802.3z standard). The frames from the serial interface transmitter 105 in the DSP 10 may be received by the serial interface receiver 111, decoded by the decoder 112, and descrambled by the descrambler 113. The deframer 114 may receive the descrambled frames from the descrambler 113 at an input E, and communicate with a frame sync acquisition module 116 at H and send digital samples to DACs 115A and 115B at outputs F and G. The deframer 114 may synchronize to the predetermined format of the frames, communicate with the frame sync acquisition module 116 to locate the start of each frame, and deframe each of the frames to extract I and Q digital samples and control information from the frames. The I and Q digital samples may be converted into analog signals I-ch and Q-ch by the DACs 115A and 115B, and subsequently processed in the analog domain (filtering, up-conversion etc.) for transmission on an analog interface, e.g., a coaxial cable or a wireless interface. The control information at an output R may be used to update a register 117, which stores information for controlling the operation of the analog front end 11.

During a receiving time slot, analog signals on the analog interface may be converted into digital samples, which may be forwarded to the signal processor 216 in the DSP 21 along the receiving path. Specifically, ADCs 201A and 201B may receive the analog signals I-ch and Q-ch and convert them into digital samples. The framer 202 may receive the digital samples from the ADCs 201A and 201B at inputs I and J, and control information from a register 217 at an input K. The framer 202 may organize the digital samples and the control information in a predetermined format, e.g., the one shown in FIG. 2, to generate frames each containing both sampled data and control information and send the frames out at an output L. In one embodiment, the framer 202 may generate frames which only contain control information, loading 0s in the data field 220.

In one embodiment, the framer 202 may add frame sync acquisition information to each of the frames to help the deframer 214 to locate the start of a frame.

The scrambler 203 may receive the frames from the framer 202 and randomize the received frames. The encoder 204 may be an 8/10 bit encoder (IEEE802.3z standard). It may receive the randomized frames from the scrambler 203, and encode the frames such that the DC value of the output stream is close to 0. The serial interface transmitter 205 may be a 3 GB serial interface. It may receive the encoded frames from the encoder 204, and transmit them to the DSP 21.

At the DSP 21, the serial interface receiver 211 may be a 3 GB serial interface, and the decoder 212 may be an 8/10 bit decoder (IEEE802.3z standard). The frames from the serial interface transmitter 205 in the analog front end 20 may be received by the serial interface receiver 211, decoded by the decoder 212, and descrambled by the descrambler 213. The deframer 214 may receive the descrambled frames from the descrambler 213 at an input M, and be coupled to a frame sync acquisition module 215 at P and to the signal processor 216 at outputs N and O. The deframer 214 may synchronize to the predetermined format of the frames, communicate with the frame sync acquisition module 215 to locate the start of each frame, and deframe the frames to extract I and Q digital samples and control information from the frames. The I and Q digital samples may be sent to the signal processor 216 and processed in the digital domain. The control information at an output Q may be sent to the signal processor 216 as well, e.g., as content of registers in read operations.

Figure 2:
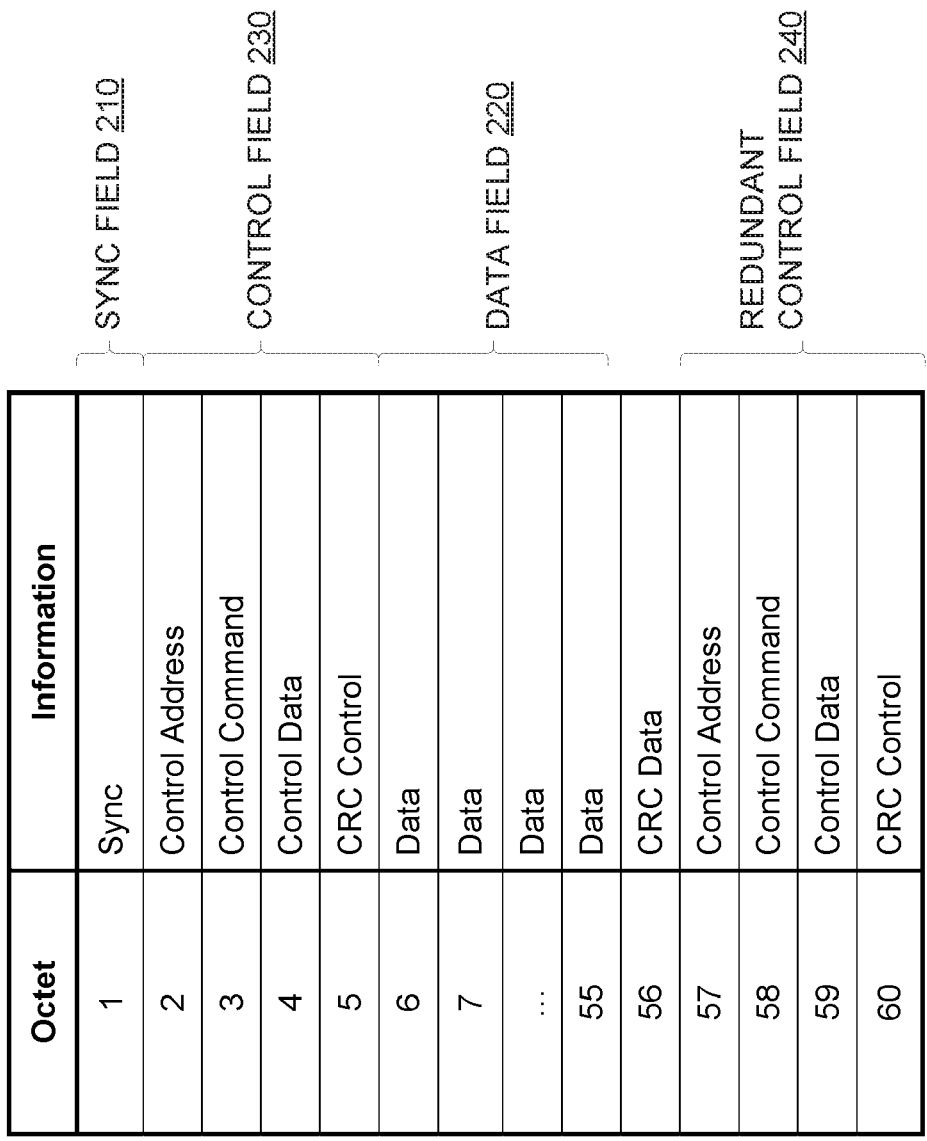
FIG. 2 illustrates an exemplary frame for transmitting sampled data and control information between a DSP and an RF/analog front-end in a high speed communication modem according to one embodiment of the present invention.

FIG. 2 illustrates an exemplary frame 200 for transmitting sampled data and control information between a DSP and an RF/analog front-end in a high speed communication modem according to one embodiment of the present invention. As shown in FIG. 1, the frame 200 may be generated by the framer 102 and transmitted from the serial interface transmitter 105 in the DSP 10 to the serial interface receiver 111 in the analog front end 11, or be generated by the framer 202 and transmitted from the serial interface transmitter 205 in the analog front end 20 to the serial interface receiver 211 in the DSP 21.

The frame 200 may comprise various fields, each may consist of one or more bytes or octets. In one embodiment, the frame 200 may have a sync field 210 for identifying the frame boundary, a data field 220 for carrying the sampled data, and a control field 230 for transferring control information to update RF/analog front-end registers, such as automatic gain control (AGC). The framers (e.g., 102 in FIG. 1A and 202 in FIG. 1B) and deframers (e.g., 114 in FIG. 1A and 214 in FIG. 1B) may be synchronized to the structure of the frame 200, so that they can extract control information and data from the right octets in the frame 200. For the sake of simplicity, the frame shown in FIG. 2 may contain only one packet as its payload, although it is known that a frame may carry more than one packets. The packet of data may fill octets of the data field 220, starting from its first octet, octet 6.

The sync field 210 of the frame 200 may be Octet 1, and may correspond to a particular character. In one embodiment, the sync field 210 may be the comma character when using K28.7 (IEEE802.3z standard), e.g., 0011111000 or its complement depending on the status of the disparity field. The sync octet may be generated and added to a frame 200 by the framer 102 in FIG. 1A.

The control field 230 may include octets 2-5. In the transmitting path, the control field 230 may be used for write/read operations of the RF/analog front-end registers, such as AGC. Specifically, the control octet 2 may contain a control address, i.e., the address of the RF/analog front-end register. The octet 3 may contain a control command, i.e., the command type write or read. The octet 4 may contain control data, e.g., data to be written for a write operation. The control information may be from the signal processor 101 in the DSP 10.

In the receiving path, the control field 230 may be used by the RF/analog front-end to report the address and content of registers to be read or the status of the analog front-end. Specifically, the control octet 2 may contain the address of the RF/analog front-end register in an operation, the octet 3 may contain the command type (e.g., read), and the octet 4 may contain data for read operations. In addition, the RF/analog front-end may keep track of synchronization state and synchronization events (LOS) and report them to the DSP with the control field.

As noted, many modem devices will be bi-directional devices and, therefore, the AFE may exchange data with a DSP in both the transmitting path and the receiving path. The frame structure of FIG. 2 may be used to support bi-directional exchange of control information between the AFE and DSP. As noted, the DSP may merge control information to be transmitted to the AFE with "outbound" data in the transmitting direction and the AFE may merge control information to be returned to the DSP with "inbound" data in the receiving direction. This bi-directional communication also may support command-response interplay between the components. For example, the DSP may command the AFE to report a register setting, which would be reported by the AFE in a response.

The control field 230 may have its own error detection octet 5 to protect the commands against transmission errors. In one embodiment, the error detection octet 5 may be a CRC code. It will be appreciated that well-known methods other than CRC, e.g., BCH codes and Reed-Solomon codes, may be used to ensure the integrity of the commands.

To further protect the commands against transmission errors, the frame 200 may include a redundant control field 240, using octets 57-60 to repeat octets 2-5. Specifically, the control octet 57 may repeat the control octet 2, containing the address of the RF/analog front-end register in an operation; the control octet 58 may repeat the control octet 3, containing the command type (e.g., write or read); the control octet 59 may repeat the control octet 4, containing data to be written or read, and the control octet 60 may repeat the control octet 5, containing the CRC control. The two control fields may be separated by other fields (e.g., data), and the spacing between the control fields may help to ensure protection against errors caused by, for example, impulse noises.

In one embodiment, there may be two operation modes, "normal" and "fast." In the normal mode, the control command may be executed only if the two control fields are identical octet by octet. In the fast mode, the control command may be executed once the CRC control field is found to be correct in one of the two control fields.

Figure 3:
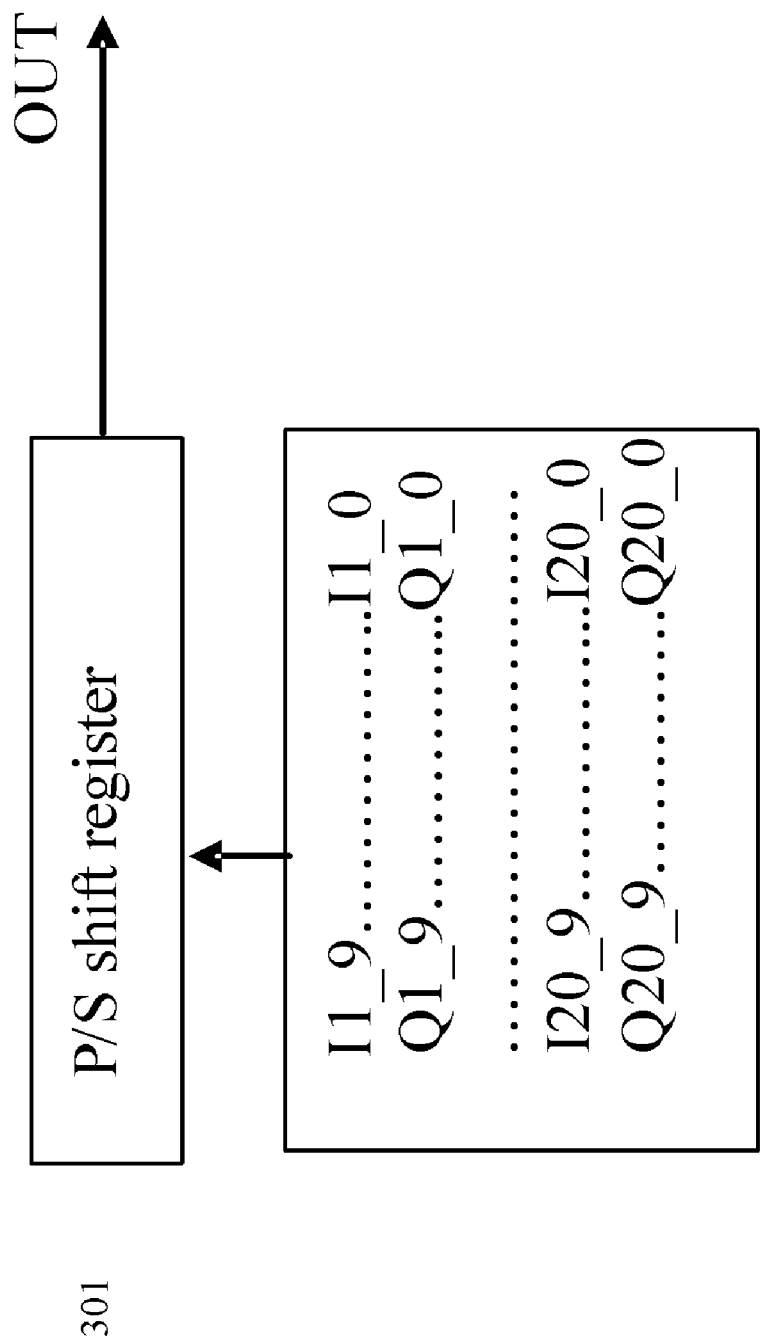
FIG. 3 illustrates a method for loading sampled data to a frame according to one embodiment of the present invention.

The data field 220 may contain, for example, 40 channel samples including 20 I channel samples I1 to I20 and 20 Q channel samples Q1 to Q20, as shown in FIG. 3. Each channel sample may have 10 bits, e.g., bits 0 to 9. The 40 10-bit I and Q channel samples may be converted into 50 octets of data, e.g., octets 6-55 in the frame 200, by a parallel-to-serial shift register 301. The parallel-to-serial shift register 301 may have ten parallel inputs, which may receive the 10 bits of a channel sample in parallel at a time, starting with the first I channel sample I1, continuing with Q1, I2 . . . I20 and finishing at Q20. The parallel-to-serial register 301 may convert the parallel inputs into a serial data stream and output the serial data stream to fill octets 6-55 in the frame 200.

A CRC data octet 56 may be used to evaluate the error rate across the frame 200 and may be generated by the framer 102 in FIG. 1A.

For a given clock rate, the serial interface transmitters 105 and 205 may support variable data rates by inserting null frames to match the data rate to the clock rate. The null frames may be identified by specific codes in the control field.

Although the control field 230 and the data field 220 are illustrated as having 4 and 50 octets respectively, the principles of the present invention extend to frames having different lengths than shown.

Figure 4:
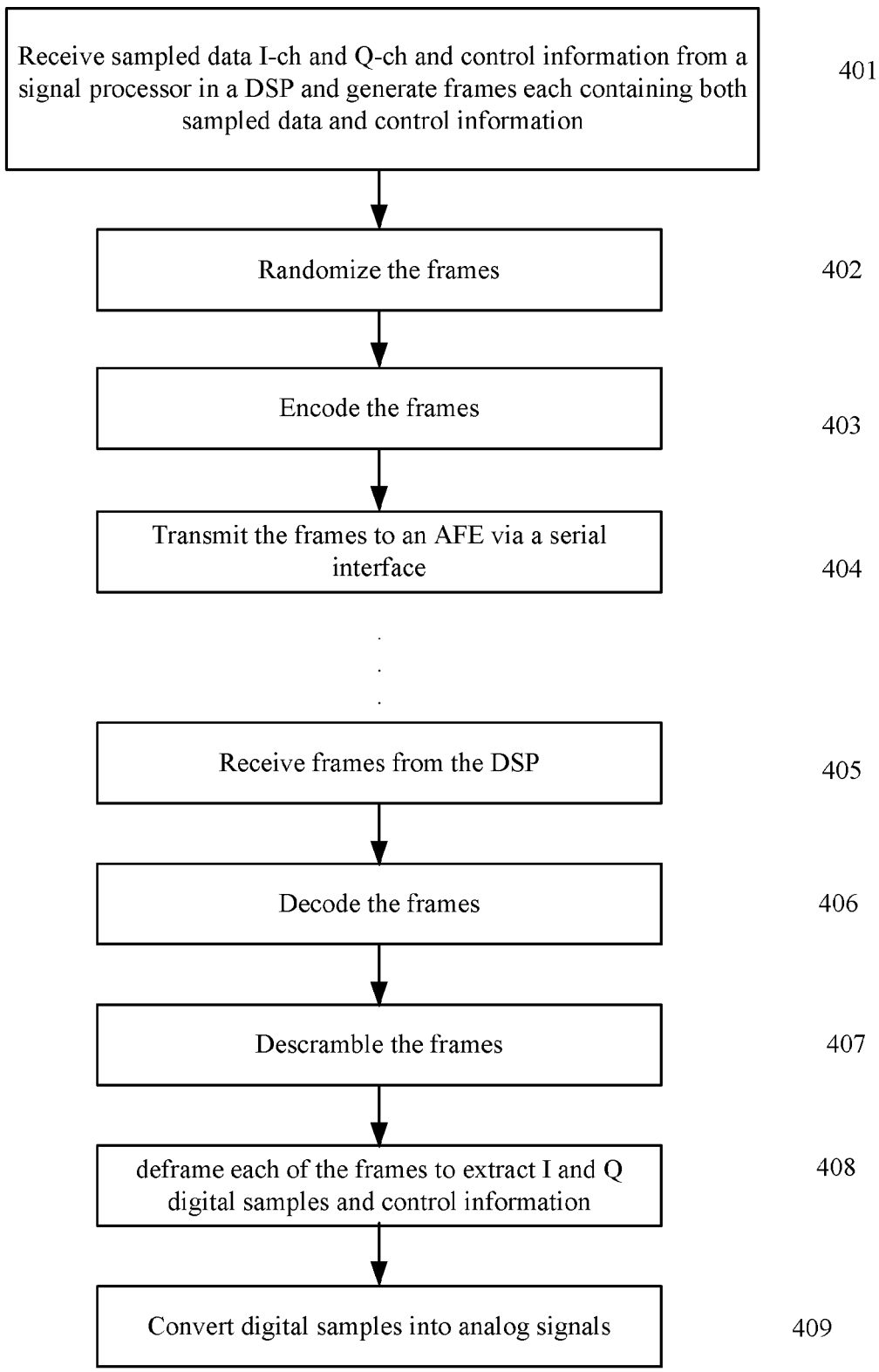
FIG. 4 is a flowchart of a method for transmitting a frame from a DSP to an AFE according to one embodiment of the present invention.

FIG. 4 illustrates the operation of the transmitting path in FIG. 1A according to one embodiment of the present invention.

At 401, the framer 102 may receive sampled data I-ch and Q-ch and control information from the signal processor 101, and organize the received sampled data and control information in a predetermined format, e.g., the one shown in FIG. 2, to generate frames each containing both sampled data and control information.

At 402, the scrambler 103 may receive the frames from the framer 102, and randomize the received frames.

At 403, the encoder 104 may receive the randomized frames from the scrambler 103, and encode the frames such that the DC value of the output stream may be close to 0.

At 404, the serial interface transmitter 105 may transmit a serial bit stream formed by the encoder 104 to the AFE 11 at a high data rate, for example, 3 GB/s.

The frames from the serial interface transmitter 105 in the DSP 10 may be received by the serial interface receiver 111 at 405, decoded by the decoder 112 at 406, and descrambled by the descrambler 113 at 407.

At 408, the deframer 114 may receive the descrambled frames from the descrambler 113, deframe each of the frames to extract I and Q digital samples and control information from the frames, and send the I and Q digital samples to the DACs 115A and 115B and the control information to the register 117.

At 409, the I and Q digital samples may be converted into analog signals I-ch and Q-ch by the DACs 115A and 115B, and subsequently processed in the analog domain for transmission on an analog interface.

Figure 5:
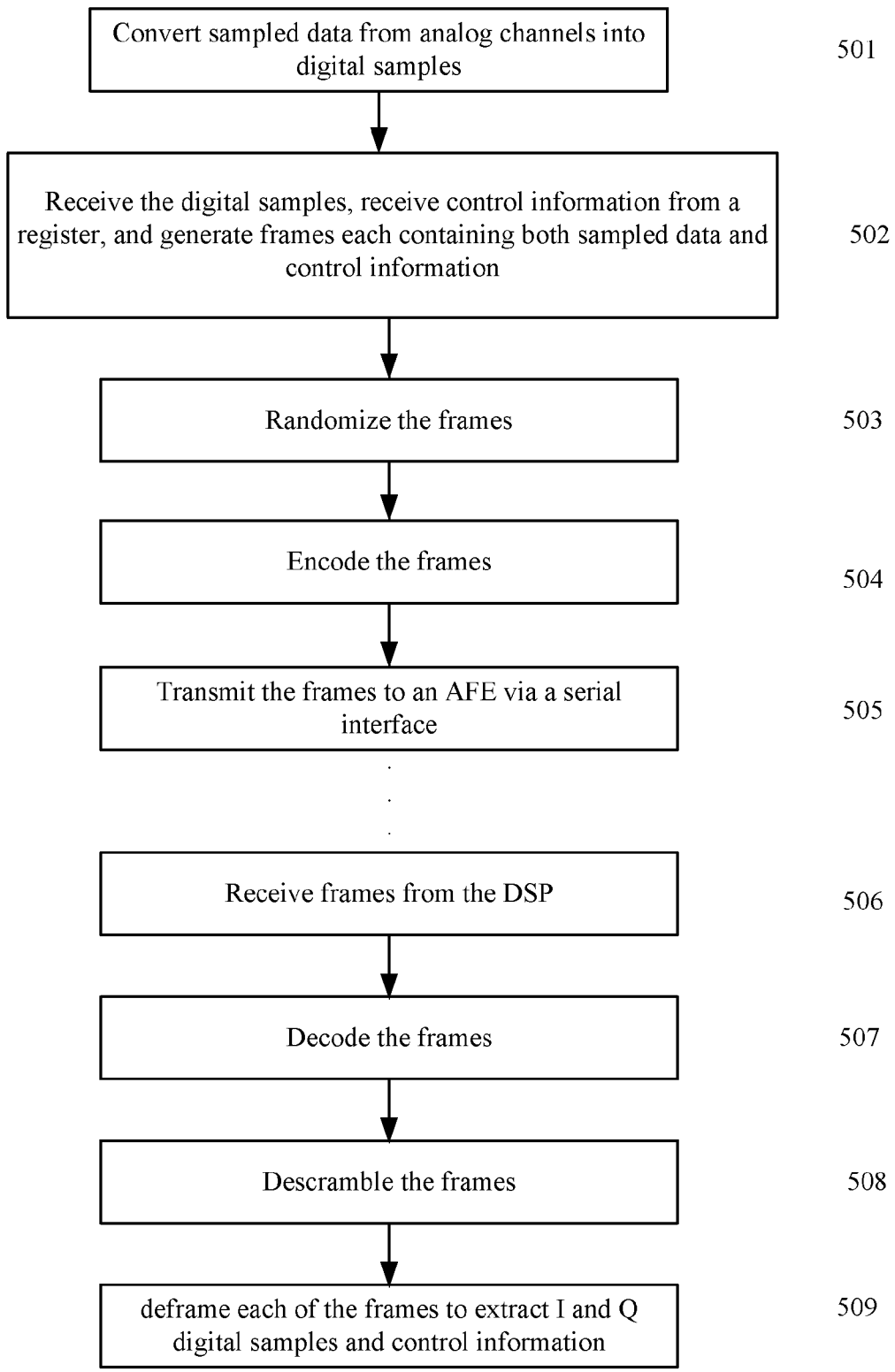
FIG. 5 is a flowchart of a method for receiving a frame from an AFE at a DSP according to one embodiment of the present invention.

FIG. 5 illustrates the operation of the receiving path in FIG. 1B according to one embodiment of the present invention.

At 501, ADCs 201A and 201B may receive analog signals I-ch and Q-ch and convert them into digital samples.

At 502, the framer 202 may receive the digital samples from the ADCs 201A and 201B and control information from the register 217, organize the digital samples and the control information in a predetermined format, e.g., the one shown in FIG. 2, to generate frames each containing both sampled data and control information.

At 503, the scrambler 203 may receive the frames from the framer 202 and randomize the received frames.

At 504, the encoder 204 may receive the randomized frames from the scrambler 203, and encode the frames such that the DC value of the output stream is close to 0.

At 505, the serial interface transmitter 205 may receive the encoded frames from the encoder 204, and transmit them to the DSP 21.

The frames from the serial interface transmitter 205 in the analog front end 20 may be received by the serial interface receiver 211 at 506, decoded by the decoder 212 at 507, and descrambled by the descrambler 213 at 508.

At 509, the deframer 214 may receive the descrambled frames from the descrambler 213, deframe the frames to extract I and Q digital samples and control information from the frames, and send the I and Q digital samples and the control information to the signal processor 216.

Further embodiments are also possible, which are the result of subsets of elements of, or variously combining elements of, embodiments described herein.

What is claimed is:

1. A method for transferring transmit data and control information between a digital signal processor (DSP) and an analog front-end device (AFE) in a high speed communication modem, the method comprising:
   receiving transmit data to be communicated by the modem;
   receiving control information to be communicated between the DSP and the AFE;
   generating a frame, the frame including:
   a data field for transferring the transmit data; and
   a first control field for transmitting the control information, the first control field including an octet containing a control command for transmitting the frame between the DSP and the AFE;
   encoding, by an 8/10 bit encoder, the frame; and
   transmitting the encoded frame between the DSP and the AFE.

2. The method of claim 1, wherein the encoded frame is transmitted from the DSP to the AFE, the transmit data is received from the DSP at an output thereof and transmitted from the AFE along an analog communication link.

3. The method of claim 1, wherein the encoded frame is transmitted from the AFE to the DSP, the transmit data is received by the AFE from an analog communication link and is received by the DSP at an input thereof.

4. The method of claim 1, wherein the first control field further comprises an octet containing a control address.

5. The method of claim 1, wherein the first control field further comprises an octet containing control data.

6. The method of claim 1, wherein the control command is a read command for reading data from a register in the analog front-end.

7. The method of claim 1, wherein the control command is a write command for writing data to a register in the analog front-end.

8. The method of claim 4, wherein the control address is an address of a register in the analog front-end and wherein the register is involved in an operation of the control command.

9. The method of claim 5, wherein the control data is data involved in an operation of the control command.

10. The method of claim 1, wherein the first control field further comprises a cyclic redundancy check (CRC) control octet for error detection in the control field.

11. The method of claim 1, further comprising adding a frame sync field to the frame indicating the start of the frame.

12. The method of claim 1, wherein the frame further comprises a second control field which is a repetition of the first control field.

13. The method of claim 12, wherein the first control field and the second control field are separated by the data field.

14. The method of claim 12, further comprising: executing the control command only when the first control field and the second control field are identical.

15. The method of claim 10, further comprising: executing the control command when the control CRC is correct.

16. The method of claim 1, further comprising: adding to the data field a CRC octet for error detection in the data field.

17. The method of claim 1, further comprising: storing the control information in a register.

18. A frame generator circuit for generating a frame to transfer sampled data and control information between a digital signal processor (DSP) and an analog front-end device (AFE) in a high speed communication modem, the framer comprising:
   a first input for receiving sampled data from a signal processor in the DSP;
   a second input for receiving control information from the signal processor in the DSP; and
   an output for providing a frame which includes:
   a data field for transferring the sampled data, the data field including one or more data octets; and
   a control field for transmitting the control information, the control field including an octet containing a control address, an octet containing a control command, and an octet containing control data,
   wherein the frame is encoded with an 8/10 encoder, and the encoded frame is transferred between the DSP and the AFE.

19. The frame generator circuit of claim 18, wherein the control address is an address of a register in the analog front-end and wherein the register is involved in an operation of the control command.

20. The frame generator circuit of claim 18, wherein the control data is data involved in an operation of the control command.

21. The frame generator circuit of claim 18, wherein the control field further comprises a cyclic redundancy check (CRC) control octet for error detection in the control field.

22. The frame generator circuit of claim 18, adding a frame sync field to the frame to locate the start of the frame.

23. The frame generator circuit of claim 18, adding to the frame a second control field which is a repetition of the control field.

24. The frame generator circuit of claim 23, wherein the control field and the second control field are separated by the data field.

25. The frame generator circuit of claim 18, adding to the data field a CRC octet for error detection in the data field.

26. A DSP comprising the frame generator circuit of claim 18.

27. A control method for a modem device, comprising:
receiving a control command at an analog front-end device (AFE) via a serial communication link,
reading control data stored in a register of the AFE,
merging the control data with transmit data received by the AFE via an analog communication link into a frame,
encoding, by an 8/10 bit encoder, the frame, and
transmitting the encoded frame via the serial communication link between the AFE and a digital signal processor (DSP).

28. The method of claim 27, further comprising:
merging the received control command with second transmit data in a second transmit frame.

* * * * *